United States Patent

Azakami et al.

[11] Patent Number: 6,092,234
[45] Date of Patent: Jul. 18, 2000

[54] METHOD AND DEVICE FOR DETERMINING THRESHOLDS OF METRIC VALUES USED IN VITERBI SYNCHRONIZATION EVALUATION CIRCUITS

[75] Inventors: Hiroshi Azakami, Ibaraki; Masahiro Hamada, Takatsuki; Yoshikazu Hayashi, Ibaraki; Takashi Hasegawa; Noriaki Omoto, both of Takatsuki, all of Japan

[73] Assignee: Matsushita Electric Industrial Co., Ltd., Osaka, Japan

[21] Appl. No.: 08/957,952

[22] Filed: Oct. 27, 1997

[30] Foreign Application Priority Data

Oct. 25, 1996 [JP] Japan ................................ 8-283621

[51] Int. Cl.[7] .............................................. H03M 13/03
[52] U.S. Cl. ............................................................ 714/789
[58] Field of Search ................................... 714/789, 795, 714/796, 792

[56] References Cited

U.S. PATENT DOCUMENTS

| | | | |
|---|---|---|---|
| 3,872,432 | 3/1975 | Bismark | 340/146.1 AQ |
| 4,578,800 | 3/1986 | Yasuda et al. | 375/106 |
| 4,675,871 | 6/1987 | Gordon et al. | 371/46 |
| 4,932,029 | 6/1990 | Heichler | 371/43 |
| 5,050,191 | 9/1991 | No | 375/94 |
| 5,422,894 | 6/1995 | Abe et al. | 371/37.4 |

*Primary Examiner*—Albert De Cady
*Assistant Examiner*—Samuel Lin
*Attorney, Agent, or Firm*—Ratner & Prestia

[57] ABSTRACT

A method and device determines the metric value threshold used in a Viterbi synchronization evaluation circuit which enables to synchronize with a correct coding rate when multiple coding rates exist in the input signal to a Viterbi decoder. A first coding rate setting unit sets a coding rate for which the metric value threshold may need to be identified, and a second coding rate setting unit sets a coding rate other than the coding rate set by the first coding rate setting unit. A metric value threshold setting unit decreases values gradually from the maximum metric value threshold as the synchronous/asynchronous state of the Viterbi decoder is monitored by a synchronous/asynchronous monitor in order to find the minimum metric value threshold where the Viterbi decoder is not completely synchronized limit for judging asynchronicity). This minimum value is determined as the metric value threshold for the coding rate set by the first coding rate setting unit.

18 Claims, 6 Drawing Sheets

METHOD AND DEVICE FOR DETERMINING THRESHOLDS OF METRIC VALUES USED IN VITERBI SYNCHRONIZATION EVALUATION CIRCUITS

FIELD OF THE INVENTION

The present invention relates to Viterbi decoders employed in decoding signals such as digital satellite broadcasting signals, and more particularly to methods and devices for determining thresholds of metric values in Viterbi synchronization evaluation circuits and devices thereof.

BACKGROUND OF THE INVENTION

Presently, the Viterbi algorithm is often employed for decoding convolutionally encoded signals as an error-correcting code format in digital communications systems.

A Viterbi synchronization evaluation circuit is incorporated in a Viterbi decoder which decodes signals using the Viterbi algorithm, and evaluates whether the coding rate for decoding is matched to the coding rate used for encoding transmitted signals.

Item 25 in FIG. 2 shows the configuration of the Viterbi synchronization evaluation circuit in the Viterbi decoder.

A Viterbi synchronization evaluation circuit 25 comprises a metric value calculator 21, a metric value threshold memory 22, and a synchronization evaluation unit 24.

The input signal to the metric value calculator 21 is a signal comprising source data encoded with punctured codes, which are extended convolutional codes (hereafter referred to as the convolutionally encoded signal). The metric value calculator 21 calculates a specific number of path metric normalizations (hereafter referred to as the metric value) of the signal input to the Viterbi synchronization evaluation circuit during a preset metric value measuring time.

The metric value threshold setting unit 20 sets a metric value threshold value (hereafter referred to as the metric value threshold) for each predetermined multiple punctured coding rate (hereafter referred to as an individual coding rate). How set values are determined is explained later. The metric value threshold setting unit 20 stores each metric value threshold, determined according to the individual coding rate, in the metric value threshold memory 22.

Next, the metric value, calculated by the synchronization evaluation unit 24, is compared with one of the multiple metric value thresholds stored in the metric value threshold memory 22. Based on comparison, the synchronization evaluation unit 24 determines whether the Viterbi decoder is synchronized or not. More specifically, whether the coding rate used for decoding is the same coding rate as that used for encoding transmitted signals is evaluated.

In case of:

Metric value<Metric value threshold, decoding by the Viterbi decoder is judged to be synchronized to the input convolutionally encoded signal, and the synchronization evaluation unit 24 outputs a synchronous signal.

In case of:

Metric value>Metric value threshold, decoding by the Viterbi decoder is judged to be non-synchronized to the input convolutionally encoded signal, and the synchronization evaluation unit 24 outputs an asynchronous signal. When decoding is judged to be asynchronous, the Viterbi synchronization evaluation circuit 25 selects a metric value threshold of another coding rate stored in the metric value threshold memory 22, and recompares it with the next input signal calculated as a metric value by the metric value calculator 21.

This operation is repeated until Viterbi decoding is judged to be synchronized. In this way, the Viterbi synchronization evaluation circuit 25 determines whether Viterbi decoding is synchronized or not.

The coding rate used for convolutionally encoding the input signal can also be identified from the metric value threshold selected from the metric value threshold memory 22.

The metric value threshold used in the Viterbi synchronization evaluation circuit 25 in the prior art is determined as below by the metric value threshold determining device.

FIG. 3 shows a block diagram of a metric value threshold determining device for determining the metric value threshold used in the Viterbi synchronization evaluation circuit 25 in the prior art. The conventional metric value threshold determining device comprises a convolutional encoder 13, Viterbi decoder 17, a coding rate setting unit 31 for setting the coding rate to the convolutional encoder 13 and Viterbi decoder 17, a source data output unit for outputting source data, a Eb/No setting unit 14 for setting Eb/No which shows energy per bit/noise power density, a synchronous/asynchronous monitor 18 for monitoring synchronous/asynchronous state, a metric value measuring time setting unit 15 for setting the metric value measuring time, a metric value threshold setting unit 20 for setting the metric value threshold, and a metric value monitor 19 for monitoring metric values. A Viterbi synchronization evaluation circuit 25 is included in the Viterbi decoder 17. The s Viterbi decoder 17 decodes the signal using the Viterbi algorithm employing a coding rate set by the coding rate setting unit 31, which is the same coding rate as that set in the convolutional encoder 13.

The metric value threshold for individual coding rate which may be required to be stored in the metric value threshold memory 22 shown in FIG. 2 is determined by the metric value threshold determining device shown in FIG. 3.

Procedures for determining metric value threshold in the prior art are explained next.

The coding rate setting unit 31 sets coding rates used for transmitting source data to the convolutional encoder 13 and the Viterbi decoder 17. The source data output from the source data output unit 11 is convolutionally encoded by the convolutional encoder 13 using the coding rate set by the coding rate setting unit 31. The Eb/No setting unit 14 adds noise with a specified Eb/No level to the output signal from the convolutional encoder 13, and outputs it to the Viterbi decoder 17. The metric value monitor 19 measures the metric value while the metric value measuring time setting unit 15 changes the metric value measuring time. The synchronous/asynchronous monitor 18 then monitors the synchronous/asynchronous state.

When decoding is synchronized, the distribution 4a of metric values M measured by the metric value monitor 19 collects at small values in a small area as shown in FIG. 4A. The distribution may be dispersed at first, but it will stabilize as the metric value measuring time is extended. The maximum value in the distribution of metric values is considered to be M1.

The signal whose output order of convolutionally encoded signal is intentionally changed or whose Eb/No is intentionally impaired by the Eb/No setting unit is then input to the Viterbi decoder 17. Viterbi decoding of the signal after such operation becomes asynchronous, and metric values M measured by the metric value monitor 19 in the asynchronous state exceed the values in FIG. 4A. Its distribution 4b will be as shown in FIG. 4B. The minimum value in this metric value distribution is considered to be M2.

FIG. 4C is the combination of the metric value distributions 4a and 4b in FIGS. 4A and 4B. When the metric values M for the synchronous and asynchronous states measured during a specified metric value measuring time do not overlap and are separately distributed as shown in FIG. 4C, the metric value measuring time can be judged to be effective. The values M1 to M2, values between the synchronous and asynchronous states which are distributed separately, are then selected and determined as the metric value threshold. The metric value threshold for each of coding rates is determined following the above procedures.

The prior art, however, did not consider the relation with metric values for other coding rates. Therefore, when the transmitted signal is convolutionally encoded using a coding rate different from that set in the Viterbi decoder 17, metric values M generated by decoding this signal may show the distribution 4Xb. Specifically, the minimum metric value M2 for the asynchronous state may fall below the maximum metric value M1 for the synchronous state. Metric values for the synchronous and asynchronous states are therefore not separated: they overlap, disrupting determination of the appropriate metric value threshold.

SUMMARY OF THE INVENTION

The present invention offers a method and device for determining the metric value threshold used in a Viterbi synchronization evaluation circuit of a Viterbi decoder which decodes transmitted signals convolutionally encoded using multiple coding rates. The method of the present invention comprises the steps of setting one of coding rates used for the transmitted signals to the Viterbi decoder, convolutionally encoding signals using the coding rates used for transmitted signals different from the one set to the Viterbi decoder, decoding each of the signals convolutionally encoded with each of the coding rates using the Viterbi algorithm, and determining the minimum metric value in metric values obtained by Viterbi decoding in a Viterbi synchronizing evaluation circuit as the metric value threshold for the coding rate set in the Viterbi decoder.

DESCRIPTION OF THE PREFERRED EMBODIMENTS

First Exemplary Embodiment

A first exemplary embodiment of the present invention is explained with reference to the figures.

Figure 1:
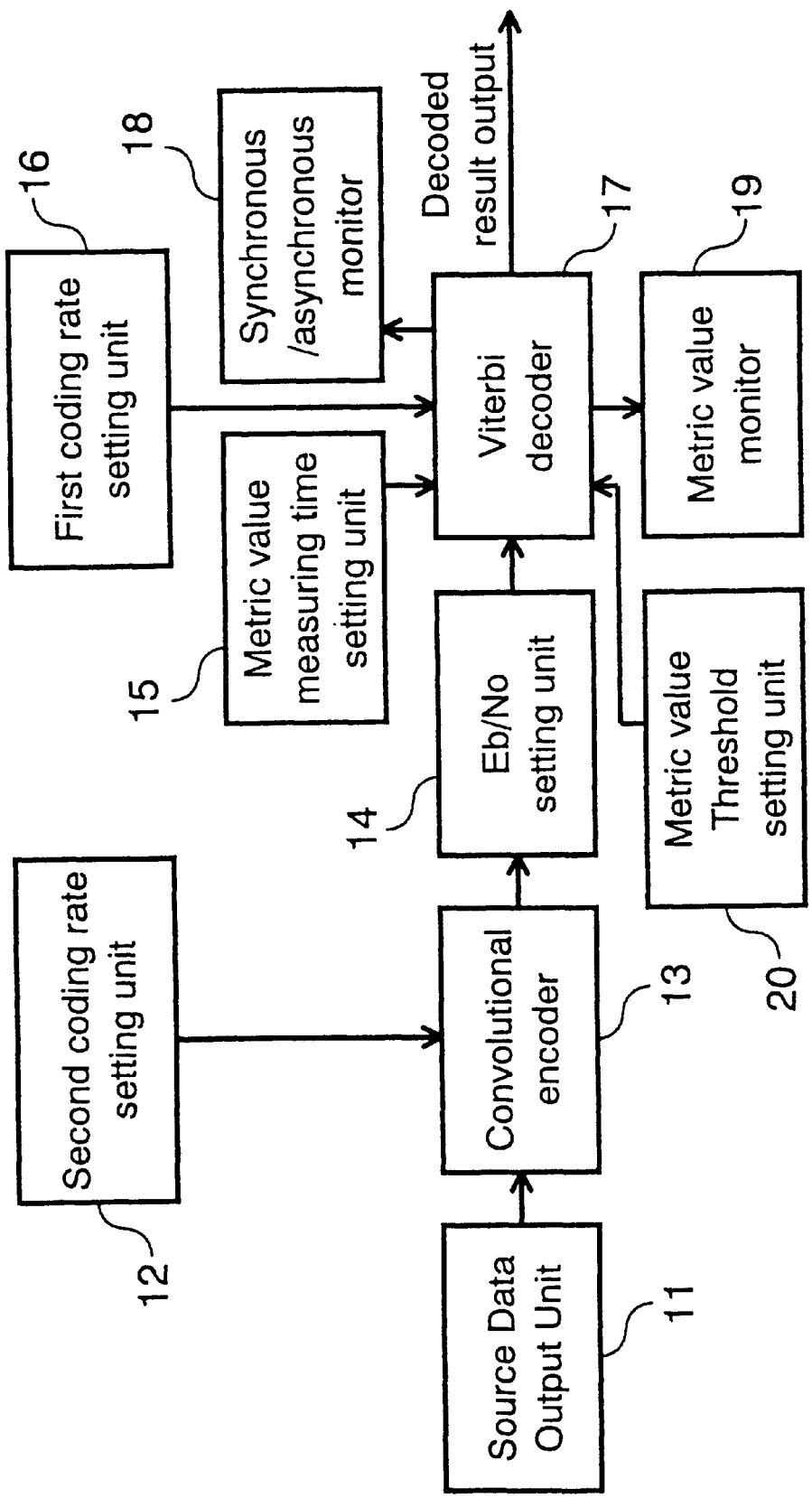
FIG. 1 is a block diagram of a metric value threshold determining device.
Figure 2:
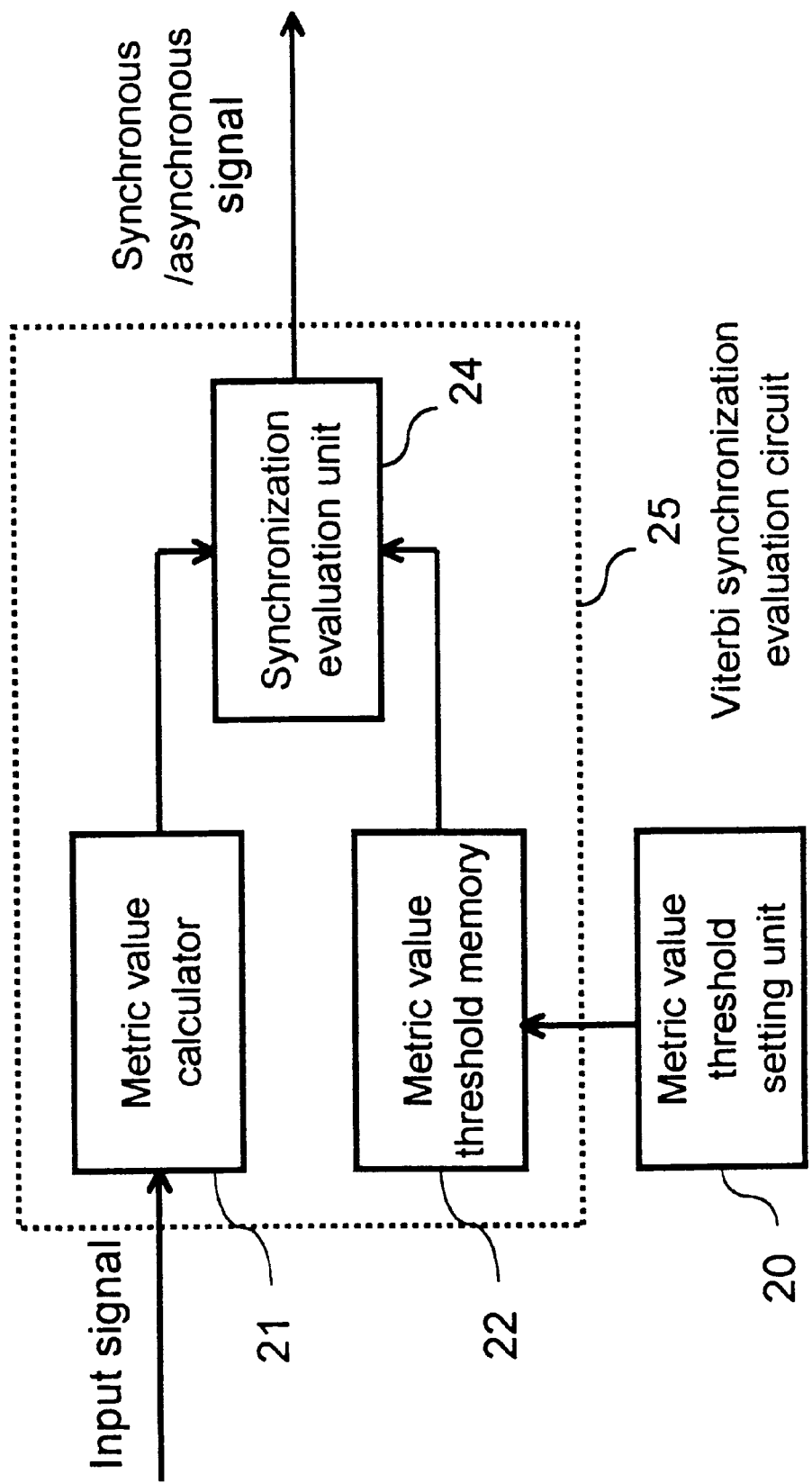
FIG. 2 is a block diagram of a Viterbi synchronization evaluation circuit.
Figure 3:
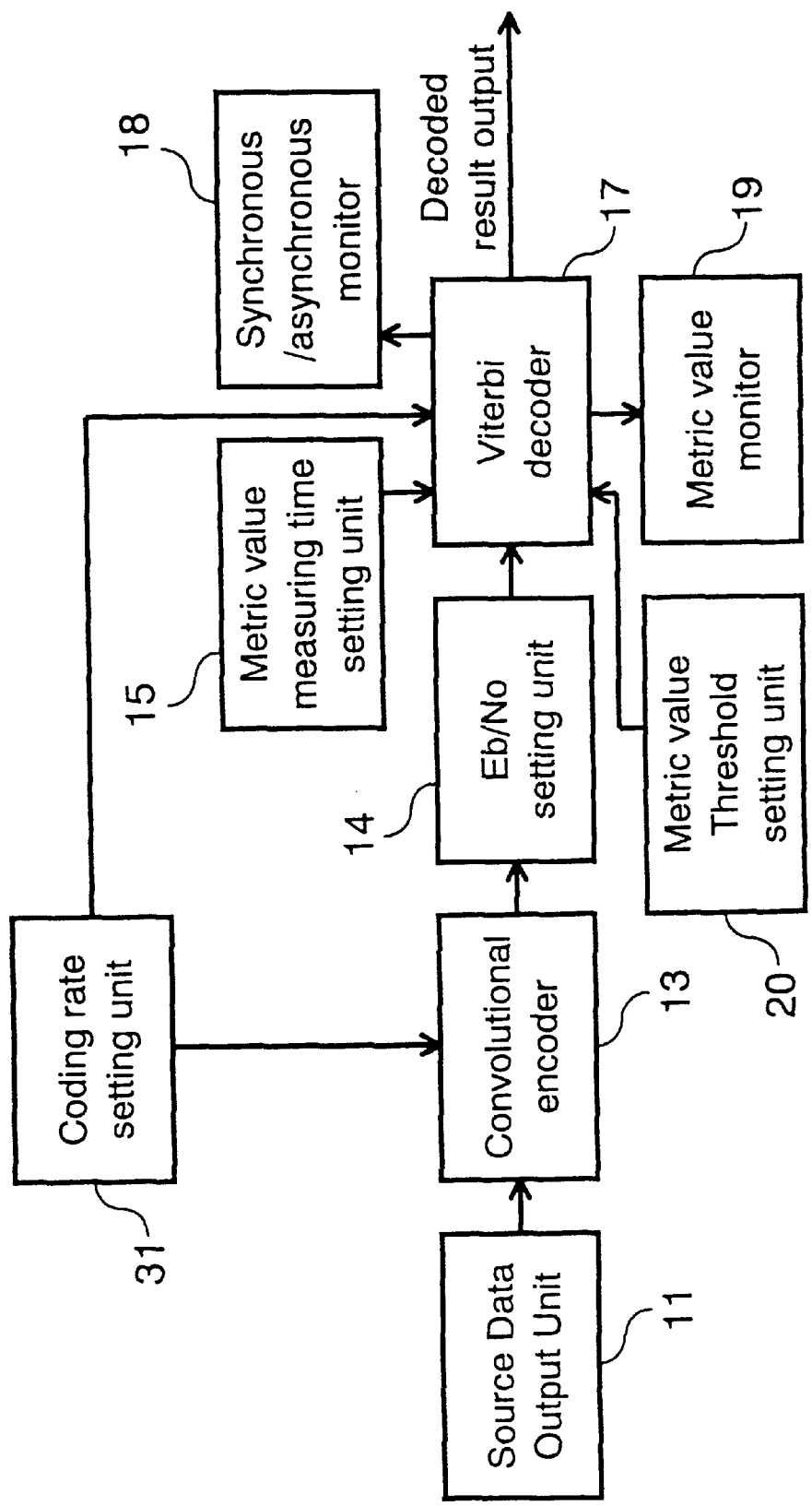
FIG. 3 is a block diagram of a metric value threshold determining device in the prior art.
Figure 4A:
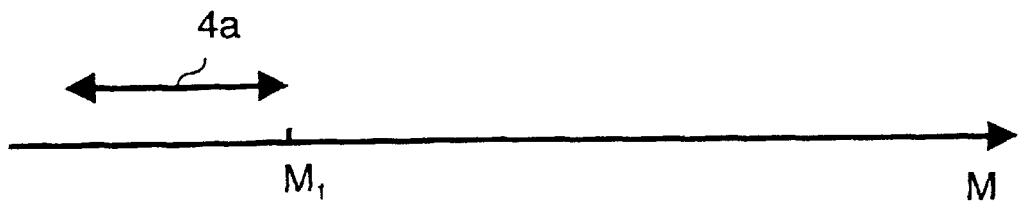
FIG. 4A shows distribution of metric values in the synchronous state.
Figure 4B:
FIG. 4B shows distribution of metric values in the asynchronous state.
Figure 4C:
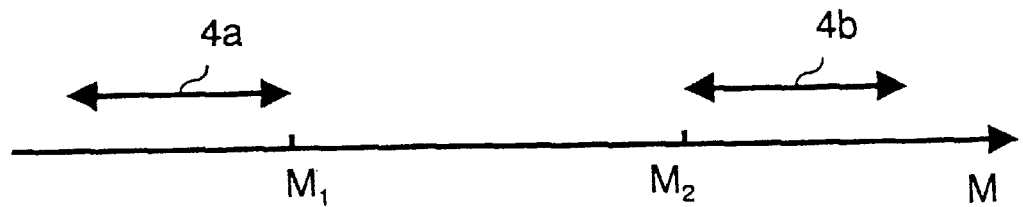
FIG. 4C shows distributions of metric values in the synchronous and asynchronous states.
Figure 4D:
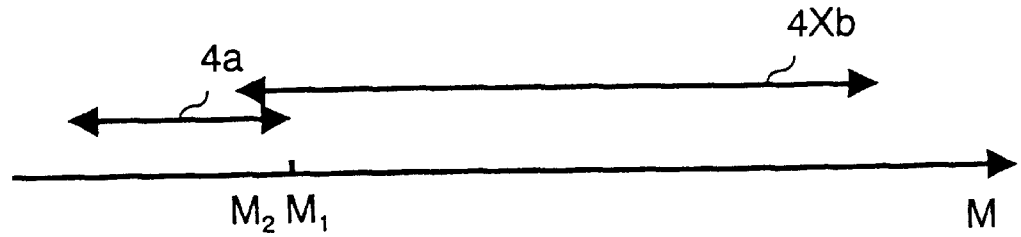
FIG. 4D shows distributions of metric values in the synchronous and asynchronous states when the two distributions overlap.

FIG. 1 shows a block diagram of a metric value threshold determining device employed in determining a metric value threshold to be set to a Viterbi synchronization evaluation circuit in a Viterbi decoder 17. Units given the same numeric codes as the prior art shown in FIG. 3 have the same functions.

A metric value threshold determining device comprises a source data output unit 11, a second coding rate setting unit 12, a convolutional encoder 13, a Eb/No setting unit 14, a first coding rate setting unit 16, a Viterbi decoder 17, a metric value measuring time setting unit 15, a metric value monitor 19, a synchronous/asynchronous monitor 18, and a metric value threshold setting unit 20.

Source data output from the source data output unit 11 is the same data as that transmitted in satellite broadcasting, and is output to the convolutional encoder 13. The convolutional encoder 13 convolutionally encodes the source data using a coding rate set by the second coding rate setting unit 12. The Viterbi decoder 17 receives the output signal from the convolutional encoder 13 after a specified Eb/No noise level set by the Eb/No setting unit 14 is applied. The Viterbi decoder 17 decodes the output signal from the Eb/No setting unit 14 using the Viterbi algorithm with a coding rate set by the first coding rate setting unit 16. The metric value monitor 19 monitors metric values generated by the Viterbi decoder 17 for the metric value measuring time set by the metric value measuring time setting unit 15.

A method for determining the metric value threshold for individual coding rate in the above configuration is explained next.

The method of the present invention is explained referring to the case, for example, where the convolutional encoder 13 convolutionally encodes and transmits source data using five types of coding rate: a, b, c, d, and e, in the transmission side, and the Viterbi decoder 17 decodes transmitted digital signals in the receiving side.

The metric value threshold is determined according to the following procedures when the Viterbi decoder 17 decodes signals using the coding rate a.

The first coding rate setting unit 16 sets the coding rate a to the Viterbi decoder 17. On the other hand, the second coding rate setting unit 12 sets a coding rate other than that set by the first coding rate setting unit 16, for example, the coding rate b, to the convolutional encoder 13. The convolutional encoder 13 encodes source data output from the source data output unit 11 using the coding rate b set by the second coding rate setting unit 12. The Eb/No setting unit 14 which sets the Eb/No level of the output signal from the convolutional encoder 13 to the limit of Viterbi synchronizing Eb/No level, the marginal limit for Viterbi decoding. Accordingly, the Eb/No setting unit 14 adds a noise code to the output of the convolutional encoder 13 so that the Eb/No level of the output reaches the limit of Viterbi synchronizing Eb/No level that can be decoded using the Viterbi algorithm, following which it is input to the Viterbi decoder 17. The metric value measuring time setting unit 15 sets the metric value measuring time to a value in which metric values are fully stabilized (for example, 1 msec.). The metric value monitor 19 monitors the metric value calculated by the Viterbi synchronization evaluation circuit.

When the signal convolutionally encoded with the coding rate b is received and decoded using the Viterbi algorithm with the coding rate a, it is determined to be asynchronous.

Figure 5A:
FIG. 5A shows distribution of metric values when signals are decoded using a different coding rate from the one used for convolutional encoding.

FIG. 5A shows the distribution 5a,b of metric values M when the signal which is convolutionally encoded using the encoding rate b is decoded using the Viterbi algorithm with the coding rate a. The distribution 5a,b shows the distribution of metric values in the asynchronous state, and its minimum value is considered to be M2ab.

Figure 5B:
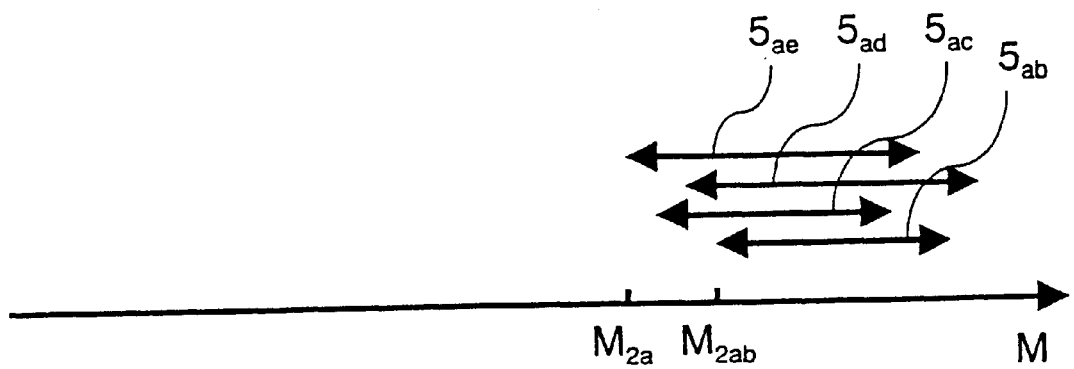
FIG. 5B shows distribution of metric values when signals convolutionally encoded using multiple coding rates are decoded with a coding rate different from those used for coding.

In the same way, the first coding rate setting unit 16 remains setting the coding rate a to the Viterbi decoder 17, and the second coding rate setting unit 12 sets a coding rate different to that set in the Viterbi decoder 17, for example, the coding rate c, to the convolutional encoder 13. This also results in asynchronicity. Distribution of metric values M will be as shown as 5ac in FIG. 5B. Then, the first coding rate setting unit 16 remains setting the coding rate a to the Viterbi decoder 17, and the second coding rate setting unit 12 sets another coding rate other than that set in the Viterbi decoder 17, for example, the coding rate d and e consecutively, to the convolutional encoder 13. Asynchronous distributions shown as 5ad and 5ae in FIG. 5B are obtained this way. Accordingly, asynchronous metric values measured by the metric value monitor 19 show different distributions for individual coding rate.

In FIG. 5B, M2a is the minimum value in the entire asynchronous metric value distributions 5ab, 5ac, 5ad, and 5ae. This is the marginal metric value in the asynchronous state, that is, the metric value threshold. As described above, the metric value threshold M2a is obtained when signals convolutionally encoded with the coding rates b, c, d, and e are received and decoded using the Viterbi algorithm with the coding rate a. The metric value threshold M2a to be used when the Viterbi decoder 17 decodes signals using the coding rate a is thus determined.

Figure 5C:
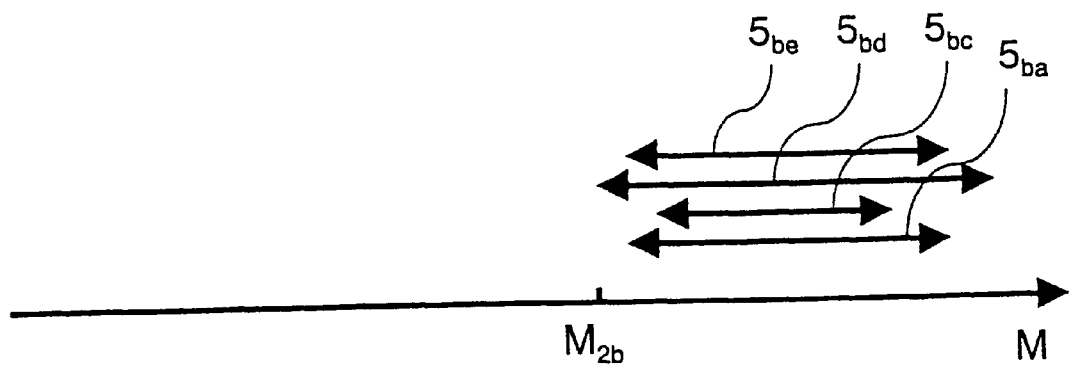
FIG. 5C shows another distribution of metric values when signals convolutionally encoded using multiple coding rates are decoded using a coding rate different from those used for coding.

Likewise, the metric value thresholds M2b, M2c, M2d, and M2e to be used when the Viterbi decoder 17 decodes using the coding rates b, c, d, and e are determined. More specifically, the metric value thresholds M2b, M2c, M2d, and M2e can be determined based on the same method when the Viterbi decoder 17 uses the coding rate b for decoding signals convolutionally encoded with the coding rates a, c, d, and e, when the Viterbi decoder 17 uses the coding rate c for decoding signals convolutionally encoded with coding rates a, b, d, and e, when the Viterbi decoder 17 uses the coding rate d for decoding signals convolutionally encoded with coding rates a, b, c, and e, and when the Viterbi decoder 17 uses the coding rate e for decoding signals convolutionally encoded with coding rates a, b, c, and d. FIG. 5C shows the metric value threshold M2b obtained when the Viterbi decoder 17 employs the coding rate b for decoding signals convolutionally encoded with the coding rates a, c, d, and e.

The metric value threshold setting unit 20 stores the metric value thresholds M2a, M2b, M2c, M2d, and M2e for the coding rates a, b, c, d, and e obtained in the metric value threshold memory 22.

As explained above, metric value thresholds are set to a receiver which receives signals convolutionally encoded with multiple coding rates. In other words, all probable coding rates to be received are set to the Viterbi decoder 17, and the metric value monitor 19 measures metric values when the Viterbi decoder 17 receives transmitted signals convolutionally encoded with coding rates other than the coding rate set in the Viterbi decoder 17. Each metric value threshold can be determined based on the measured minimum metric value for each of the probable coding rates to be received.

Second Exemplary Embodiment

A second exemplary embodiment also determines the metric value threshold employing a metric value threshold determining device same as the first exemplary embodiment.

In the first exemplary embodiment, the metric value threshold is determined based on the minimum metric value obtained by the metric value monitor 19. In the second exemplary embodiment, the metric value threshold is determined by monitoring results of thresholds consecutively set by a metric value threshold setting unit output to the synchronous/asynchronous monitor 18, thereby evaluating the synchronous/asynchronous state.

The operation is explained referring to the same examples as the first exemplary embodiment. The first coding rate setting unit 16 sets the coding rate a to the Viterbi decoder 17. The second coding rate setting unit 12 sets a coding rate other than that set by the first coding rate setting unit 16, for example, the coding rate b, to the convolutional encoder 13. The convolutional encoder 13 encodes source data output from the source data output unit 11 using the coding rate b set by the second coding rate setting unit 12. The Eb/No setting unit 14 which sets the Eb/No level of the output signal from the convolutional encoder 13 to the limit of Viterbi synchronizing Eb/No level, the marginal limit for Viterbi decoding. Accordingly, the Eb/No setting unit 14 adds a noise code to the output of the convolutional encoder 13 so that the Eb/No level of the output reaches the limit of Viterbi synchronizing Eb/No level that can be decoded using the Viterbi algorithm, following which it is input to the Viterbi decoder 17. The metric value measuring time setting unit 15 sets the metric value measuring time to a value in which metric values are fully stabilized. The metric value monitor 19 monitors the metric value calculated by the Viterbi synchronization evaluation circuit.

The metric value threshold setting unit 20 then decreases the metric value threshold value from the maximum value to lower values sequentially. There is no determined way to change the metric value threshold. For example, the metric value threshold can also be changed from the minimum value to greater values sequentially. The synchronous/asynchronous monitor 18 monitors the synchronous/asynchronous state of the Viterbi decoder as the metric value threshold setting is changed.

When the signal is convolutionally encoded with a coding rate different from that used in Viterbi decoding, Viterbi decoding is in the asynchronous state and the synchronous/asynchronous monitor 18 therefore may require to judge this type of decoding asynchronous. Therefore, the metric value threshold which can be used for definitely judging asynchronicity of this type of decoding can be determined. The second exemplary embodiment can thus identify maximum metric value threshold, that is a limit value for judging asynchronisity, based on the minimum metric value measured by the metric value monitor 19. In other words, the metric value threshold at receiving the signal convolutionally encoded with the coding rate b and decoding using the Viterbi algorithm with the coding rate a can be obtained.

In the same way, the first coding rate setting unit 16 remains setting the coding rate a to the Viterbi decoder 17, and the second coding rate setting unit 12 sets a coding rate different to that set in the Viterbi decoder 17, for example, the coding rate c, to the convolutional encoder 13. This also results in asynchronicity. The maximum metric value threshold, that is a limit value for judging asynchronisity, can be identified based on the minimum metric value measured by the metric value monitor 19. In other words, the metric value threshold at receiving the signal convolutionally encoded with the coding rate c and decoding using the Viterbi algorithm with the coding rate a can be obtained. Then, the first coding rate setting unit 16 remains setting the coding rate a to the Viterbi decoder 17, and the second coding rate setting unit 12 sets another coding rate other than that set in the Viterbi decoder 17, for example, the coding rate d and e consecutively, to the convolutional encoder 13. Accordingly, the metric value thresholds at receiving the signal convolutionally encoded using the coding rates b, c, d, and e and decoding using the Viterbi algorithm with the coding rate a can be obtained. The minimum metric value threshold out of these metric value thresholds is the desired metric value threshold.

Likewise, the metric value threshold can be determined based on the same method when the Viterbi decoder 17 uses the coding rate b for decoding signals convolutionally encoded with the coding rates a, c, d, and e, when the Viterbi decoder 17 uses the coding rate c for decoding signals convolutionally encoded with coding rates a, b, d, and e, when the Viterbi decoder 17 uses the coding rate d for decoding signals convolutionally encoded with coding rates a, b, c, and e, and when the Viterbi decoder 17 uses the coding rate e for decoding signals convolutionally encoded with coding rates a, b, c, and d.

When the signal convolutionally encoded with a coding rate different from that used in Viterbi decoding, Viterbi decoding is in the asynchronous state and the synchronous/asynchronous monitor 18 therefore may require to judge this type of decoding asynchronous. Accordingly, the metric value threshold which can be used for definitely judging asynchronicity of this type of decoding can be determined. The second exemplary embodiment can thus identify the metric value threshold (a limit value for judging asynchronicity) that is preferably set by the metric value threshold setting unit 20 can be identified based on the minimum metric value measured by the metric value monitor 19.

Third Exemplary Embodiment

A third exemplary embodiment also determines the metric value threshold employing a metric value threshold determining device the same as in the first exemplary embodiment.

The first coding rate setting unit 16 sets a coding rate which may require to find the metric value threshold to the Viterbi decoder 17. The second coding rate setting unit 12 sets the same coding rate than that set by the first coding rate setting unit 16 to the convolutional encoder 13. The Eb/No setting unit 14 sets the Eb/No level of the output signal from the convolutional encoder 13 to the limit of Viterbi synchronizing Eb/No level, the marginal limit for Viterbi decoding. Accordingly, the Eb/No setting unit 14 adds a noise code to the output of the convolutional encoder 13 so that the Eb/No level of the output reaches the limit of Viterbi synchronizing Eb/No level that can be decoded using the Viterbi algorithm, following which it is input to the Viterbi decoder 17. The metric value measuring time setting unit 15 sets the metric value measuring time to a value in which metric values are fully stabilized (for example, 1 msec.).

The metric value threshold setting unit 20 then increases the metric value threshold value from the minimum value to greater values sequentially. There is no determined way to change the metric value threshold. For example, the metric value threshold can also be changed from the maximum value to lower values sequentially.

The metric value monitor 19 monitors the metric value calculated by the Viterbi synchronization evaluation circuit. The synchronous/asynchronous monitor 18 monitors the synchronous/asynchronous state of decoding by the Viterbi decoder 17. When the signal convolutionally encoded with a certain coding rate is decoded using the Viterbi algorithm with the same coding rate, Viterbi decoding is synchronous. The synchronous/asynchronous monitor 18 therefore can identify the minimum metric value threshold (a limit for judging synchronicity) for judging that encoding and decoding are not completely asynchronous.

Figure 6A:
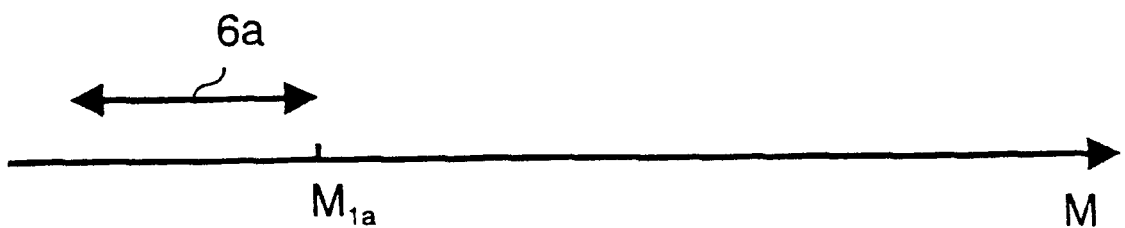
FIG. 6A shows distribution of metric values when signals convolutionally coded using a coding rate is decoded using the same coding rate.

FIG. 6A is a distribution of metric values M in the Viterbi decoder 17 measured by the metric value monitor 19 when the same coding rate a is set to the convolutional encoder 13 and Viterbi decoder 17. The maximum metric value is considered to be M1a. The value M1a identified in this way is considered to be a lower limit of the metric value threshold for the coding rate a.

Using the above procedures, the lower limit of the metric value threshold is identified for each of all coding rates to be received.

In addition, the metric value threshold for each of all probable coding rates to be received obtained in the first or the second exemplary embodiment is considered as an upper limit.

According to the above procedures, the upper and lower limits of the metric value thresholds for all coding rates to be received are calculated, and a specific value, preferably a mean value, between the upper and lower limits is determined as the metric value threshold.

Figure 6B:
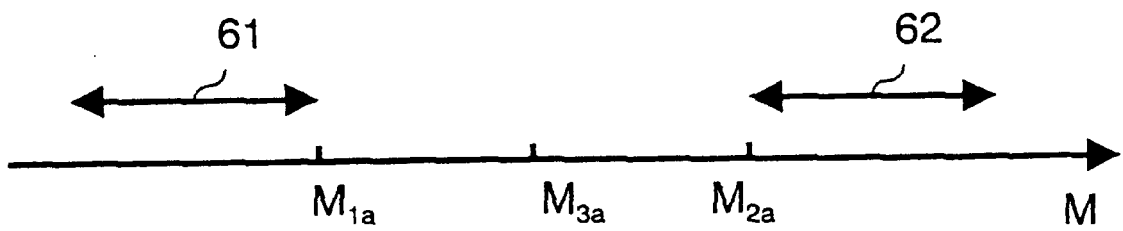
FIG. 6B shows upper and lower limits of the metric value threshold.

FIG. 6B shows a distribution 61 of metric values M in the synchronous state, a distribution 62 in the asynchronous state, and an upper limit value M2a, lower limit value M1a, and mean value M3a=(M1a+M2a) in the metric value thresholds when the coding rate a is employed.

The metric value thresholds for all coding rates calculated as the above are stored in the metric value threshold memory 22 for operating the Viterbi synchronization evaluation circuit.

In the third exemplary embodiment, how to evaluate synchronicity/asynchronicity by setting a value to the metric value threshold setting unit 22 is explained. It is apparent, however, that the metric value threshold can also be identified from the distribution of measured metric values as in the first exemplary embodiment.

As explained above, the present invention offers a Viterbi synchronization evaluation circuit which can correctly evaluate the synchronous and asynchronous states even two or more coding rates are used in input signals.

The present invention is explained with precondition that the Viterbi synchronization evaluation circuit judges decoding to be asynchronous when the metric value is greater than the metric value threshold and synchronous when the metric value is less than the metric value threshold. It will be apparent that the above relation can be defined the other way. It can be changed as required according to the design policy.

The preferred embodiments described herein are therefore illustrative and not restrictive, the scope of the invention being indicated by the appended claims and all variations which come within the meaning of the claims are intended to be embraced therein.

What is claimed is:

1. A method for determining a metric value threshold to be set to a Viterbi decoder for a receiver which receives and decodes transmitted signals convolutionally encoded using a plurality of coding rates in transmitters, the method comprising the steps of:

setting one of the plurality of coding rates to said Viterbi decoder, said plurality of coding rates used for convolutionally encoding in the transmitters;

convolutionally encoding signals using each coding rate, said each coding rate selected from others than said one of said plurality of coding rates set to said Viterbi decoder;

decoding each of the signals convolutionally encoded with said each coding rate using the Viterbi algorithm in said Viterbi decoder, generating metric values, and outputting each of said generated metric values; and determining a metric value threshold to be set to said Viterbi decoder, based on said generated metric values.

2. The method for determining the metric value threshold as defined in claim 1, further comprising the steps of setting metric value thresholds sequentially to said Viterbi decoder;

evaluating that the Viterbi decoder is in an asynchronous state if said metric values are greater than said metric value thresholds sequentially set in said Viterbi decoder; and in said step for determining a metric value threshold to be set to said Viterbi decoder, determining the minimum metric value threshold out of said metric value thresholds sequentially set in said Viterbi decoder evaluated to be in an asynchronous state as the metric value threshold for the coding rate to be set to said Viterbi decoder.

3. The method for determining the metric value threshold as defined in claim 2, further comprising the step of adding noise to said convolutionally encoded signals.

4. The method for determining the metric value threshold as defined in claim 2, further comprising the steps of:

setting metric value measuring time to said Viterbi decoder;

in said step for evaluating the Viterbi decoder being in an asynchronous state;

evaluating that the Viterbi decoder is in an asynchronous state if said generated metric values within said metric value measuring time are greater than said metric value thresholds sequentially set in said Viterbi decoder.

5. The method for determining the metric value threshold as defined in claim 1, further comprising the steps of determining the minimum metric value out of said generated metric values obtained from said decoding as an upper limit of the metric value threshold for the coding rate set in said Viterbi decoder;

setting one of the plurality of coding rates to the Viterbi decoder;

convolutionally encoding signals using said coding rate set to said Viterbi decoder;

decoding the signals convolutionally encoded with said coding rate using the Viterbi algorithm in said Viterbi decoder and outputting each of generated metric values;

determining the maximum metric value out of said generated metric values in said Viterbi decoder as a lower limit of the metric value threshold for the coding rate to be set to said Viterbi decoder; and in said step for determining a metric value threshold to be set to said Viterbi decoder, determining a metric value between said upper limit and said lower limit as the metric value threshold.

6. The method for determining the metric value threshold as defined in claim 5, wherein an average value of said upper and said lower limits is determined as the metric value threshold.

7. The method for determining the metric value threshold as defined in claim 5, further comprising the step of adding noise to said convolutionally encoded signals.

8. The method for determining the metric value threshold as defined in claim 5, further comprising the steps of:

setting metric value measuring time to said Viterbi decoder, in said step for determining the minimum metric value in said generated metric values obtained from said decoding as an upper limit of the metric value threshold for the coding rate set in said Viterbi decoder;

determining the minimum metric value out of said generated metric values obtained from said decoding within said metric value measuring time as an upper limit of the metric value threshold for the coding rate set in said Viterbi decoder;

in said step for determining the maximum metric value in generated metric values in said Viterbi decoder as a lower limit of the metric value threshold for the coding rate to be set to said Viterbi decoder;

determining the maximum metric value out of said generated metric values in said Viterbi decoder within said metric value measuring time as a lower limit of the metric value threshold for the coding rate to be set to said Viterbi decoder.

9. The method for determining the metric value threshold as defined in claim 1, further comprising the steps of setting metric value thresholds sequentially to said Viterbi decoder;

evaluating that the Viterbi decoder is in an asynchronous state if said metric values are greater than said metric value thresholds sequentially set in said Viterbi decoder;

determining the minimum metric value thresholds out of said metric value thresholds sequentially set to said Viterbi decoder evaluated to be in an asynchronous state as an upper limit of the metric value threshold for the coding rate to be set to said Viterbi decoder;

setting one of the plurality of coding rates to the Viterbi decoder;

convolutionally encoding signals using said coding rate set to said Viterbi decoder;

decoding the signals convolutionally encoded with said coding rate using the Viterbi algorithm in said Viterbi decoder and outputting each of generated metric values;

determining the maximum metric value in metric values as a lower limit of the metric value threshold for the coding rate set to said Viterbi decoder; and in said step for determining a metric value threshold to be set to said Viterbi decoder, determining a metric value between said upper and lower limits as the metric value threshold.

10. The method for determining the metric value threshold used in a Viterbi synchronization judgment circuit as defined in claim 9, wherein an average value of said upper and said lower limits is determined as the metric value threshold.

11. The method for determining the metric value threshold as defined in claim 9, further comprising the steps of:

setting metric value measuring time to said Viterbi decoder, in said step for evaluating that the Viterbi decoder is in an asynchronous, evaluating that the Viterbi decoder is in an asynchronous state if said generated metric values within said metric value measuring time are greater than said metric value thresholds sequentially set in said Viterbi decoder.

12. The method for determining the metric value threshold as defined in claim 1, further comprising the step of adding noise to said convolutionally encoded signals.

13. The method for determining the metric value threshold as defined in claim 1, in said step for determining a metric value threshold to be set to said Viterbi decoder, determining the minimum metric value out of the minimum metric value obtained from said decoding as the metric value threshold for the coding rate to be set to said Viterbi decoder.

14. The method for determining the metric value threshold as defined in claim 13, further comprising the steps of:

setting metric value measuring time to said Viterbi decoder;

in said step for determining the minimum metric value out of the minimum metric value obtained from said decoding as the metric value threshold for the coding rate to be set to said Viterbi decoder, determining the minimum metric value out of the minimum metric value obtained from said decoding within said metric value measuring time as the metric value threshold for the coding rate to be set to said Viterbi decoder.

15. The method for determining the metric value threshold as defined in claim 1, further comprising the steps of:

setting metric value measuring time to said Viterbi decoder;

in said step for determining a metric value threshold to be set to said Viterbi decoder;

determining a metric value threshold to be set to said Viterbi decoder, based on said generated metric values output from said Viterbi decoder within said metric value measuring time.

16. A metric value threshold determining device for a Viterbi synchronization evaluation circuit comprising:

source data output means for outputting source data;

second coding rate setting means for setting a coding rate;

convolutional encoding means for convolutionally encoding the output of said source data output means using said coding rate;

Eb/No setting means for adding a specified Eb/No level to the output of said convolutional encoding means;

Viterbi decoding means for decoding the output of said Eb/No setting means using the Viterbi algorithm;

metric value measuring time setting means for setting the metric value measuring time to said Viterbi decoding means;

first coding rate setting means for setting a coding rate to said Viterbi decoding means;

metric value threshold setting means for setting the metric value threshold to said Viterbi decoding means;

metric value monitor means for monitoring metric values output from said Viterbi decoding means; and synchronous and asynchronous states monitor means for identifying one of a synchronous state and an asynchronous state of said Viterbi decoding means.

17. A metric value threshold determining device as defined in claim 16, wherein said first coding rate setting means and said second coding rate setting means set a different coding rate from each other.

18. The metric value threshold determining device as defined in claim 16, wherein said Eb/No setting means modifies the Eb/No level of the output signal from said convolutional encoding means to a limit of Viterbi synchronizing Eb/No level which is the marginal limit for Viterbi decoding.

* * * * *